US008918560B2

(12) United States Patent
Nishikawa et al.

(10) Patent No.: US 8,918,560 B2
(45) Date of Patent: Dec. 23, 2014

(54) CONTROLLER FOR STORAGE DEVICE AND METHOD FOR CONTROLLING STORAGE DEVICE (75) Inventors: Hiroyuki Nishikawa, Saitama-ken (JP); Keiji Yamamoto, Tokyo (JP); Yoshiki Namba, Kanagawa-ken (JP); Taichi Tashiro, Tokyo (JP); Kohta Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 13/567,940

(22) Filed: Aug. 6, 2012

(65) Prior Publication Data

US 2013/0198420 A1    Aug. 1, 2013

(51) Int. Cl.
| G06F 3/00 | (2006.01) |
| G06F 5/00 | (2006.01) |
| G06F 13/00 | (2006.01) |
| G06F 13/28 | (2006.01) |
| G11C 7/10 | (2006.01) |
| G06F 3/06 | (2006.01) |
| G06F 5/14 | (2006.01) |

(52) U.S. Cl.
CPC .. *G06F 5/14* (2013.01); *G11C 7/10* (2013.01); *G06F 3/0659* (2013.01); *G06F 3/0611* (2013.01); *G06F 3/061* (2013.01); *G06F 3/0656* (2013.01); *G06F 3/0679* (2013.01)
USPC .................. 710/52; 710/58; 710/60; 711/167

(58) Field of Classification Search
CPC ......... G06F 5/14; G06F 3/061; G06F 3/0611; G06F 3/0656; G06F 3/0659; G06F 3/0679; G11C 7/10
USPC ................................. 710/52, 58, 60; 711/167
See application file for complete search history.

(56) References Cited

U.S. PATENT DOCUMENTS

| 8,438,356 B2* | 5/2013 | Yoon et al. ...................... 711/167 |
| 2008/0209103 A1* | 8/2008 | Haga .............................. 711/100 |
| 2012/0047318 A1* | 2/2012 | Yoon et al. ..................... 711/103 |

FOREIGN PATENT DOCUMENTS

| JP | 9-190293 A | 7/1997 |
| JP | 2001-005724 A | 1/2001 |
| JP | 2003-108314 A | 4/2003 |
| JP | 2006-085243 A | 3/2006 |
| JP | 2006-344297 A | 12/2006 |
| JP | 2011-154516 A | 8/2011 |

OTHER PUBLICATIONS

Official Action issued by Japanese Patent Office in JP Patent Application No. 2011-201296, mailed Aug. 6, 2013, 3 pages.

* cited by examiner

*Primary Examiner* — Eric Oberly
(74) *Attorney, Agent, or Firm* — Baker Botts L.L.P.

(57) ABSTRACT

A controller for a storage device is connected to a host system and the storage device. A buffer memory includes first and second storage areas. A timer counts a preset given time in response to an instruction to start counting and sends a deadline notification when A given time is elapsed. A command responding portion, when receiving a read command from the host system, instructs the timer to start counting and thereafter outputs a read instruction to read data from the storage system. A data processing portion, in response to the read instruction by the command responding portion, reads specified data from the storage device and holds the read data in the second storage area of the buffer memory. A read control portion sends the host system the data held in the second storage area of the buffer memory when the deadline notification is received from the timer.

12 Claims, 4 Drawing Sheets

CONTROLLER FOR STORAGE DEVICE AND METHOD FOR CONTROLLING STORAGE DEVICE

CROSS-REFERENCE TO RELATED APPLICATION

This application is based upon and claims the benefit of priority from the prior Japanese Patent Application No. 2011-201296, filed on Sep. 15, 2011, the entire contents of which are incorporated herein by reference.

FIELD

Embodiments of the present invention relate to a controller for a storage device and a method for controlling the storage device.

BACKGROUND

An information processing apparatus for industrial use which delivers in real time video contents stored in video servers or the like uses storage devices such as large-capacity hard disk drives.

The information processing apparatus of such a type needs to complete the processing of writing or reading data to and from the storage device within a given period of time. This is because if the time taken to write or read data exceeds a predetermined period of time, video image or sound may be interrupted.

Hard disk devices are large in capacity and low in price but have disadvantages in speed and reliability. In recent years, therefore, solid-state drives (hereinafter, referred to as SSDs) are used as high-speed storage devices in systems for industrial use (for example, see JP, P2010-102369A).

However, large-capacity SSDs used in systems for industrial use are expensive. It is therefore desired to use low-cost and general-purpose SSDs which can be connected with general-purpose interfaces such as serial ATA.

However, the storage devices such as general-purpose SSDs are not guaranteed in terms of delay time which can occur in the processing of writing or reading data. Particularly in the SSDs, specific delay phenomena represented by garbage correction occur in the process of writing data. Accordingly, general-purpose SSDs cannot be used, as they are, in apparatuses and devices which conduct real time control, for example, such as television broadcast systems.

DETAILED DESCRIPTION

According to one embodiment, a controller includes a mode table, a monitor portion, a buffer memory, a timer, a command responding portion, a data processing portion, and a read control portion. In the mode table, the operation mode of the storage device is settable to one of "Writing/Reading" and "Waiting" modes.

The monitor portion monitors the operation mode of the storage device and sets the operation mode of the storage device in the mode table. The buffer memory includes first and second storage areas. The timer counts a preset given time in response to an instruction to start counting and sends a deadline notification when the given time is elapsed. The command responding portion, when receiving a write command from the host system, receives write data transmitted from the host system within a predetermined period after the write command, holds the write data received in the first storage area of the buffer memory, and thereafter outputs a write instruction to write data to the storage device if the operation mode of the storage device is confirmed as "Waiting" in reference to the mode table. The command responding portion, when receiving a read command from the host system, instructs the timer to start counting and thereafter outputs a read instruction to read data from the storage system if the operating status of the storage device is judges as "Waiting" in reference to the mode table.

The data processing portion, in response to the write instruction by the command responding portion, reads data from the first storage area of the buffer memory and writes the read data to the storage system. The data processing portion, in response to the read instruction by the command responding portion, reads the specified data from the storage device and holds the read data in the second storage area of the buffer memory. The read control portion sends the host system the data held in the second storage area of the buffer memory when the deadline notification is received from the timer.

Figure 1:
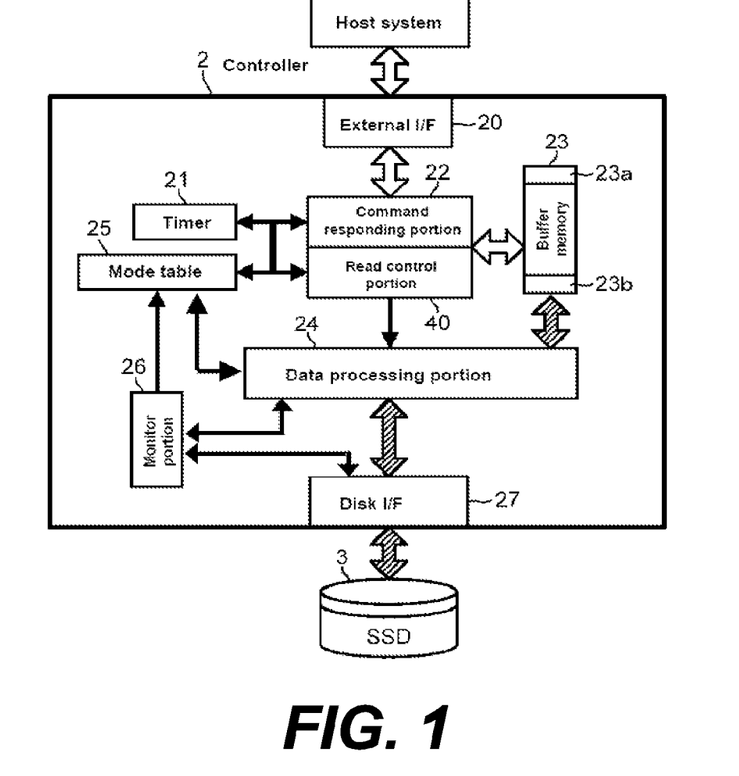
FIG. 1 illustrates a configuration of a controller of a first embodiment.

Hereinafter, a description is given in detail of an embodiment with reference to the drawings. FIG. 1 illustrates a configuration of a controller 2 according to a first embodiment.

As shown in FIG. 1, the storage device controller 2 includes an external interface 20 (hereinafter, referred to as an external I/F 20) connected to a host system 1, a timer 21, a command responding portion 22, a buffer memory 23, a data processing portion 24, a mode table 25, a monitor portion 26, a disk interface 27 (hereinafter, referred to as a disk I/F 27), and a read control portion 40.

The host system 1 is a video server, for example. The host system 1 is a system for industrial use, such as a multimedia system, an information processing system, and a manufacturing plant system, and requires a guarantee of response time in the process of writing data to a storage device or reading data from the storage device.

The disk I/F 27 is an interface for communication with the external storage device 3 and is, for example, a serial ATA (SATA-2.6 or 3.0) or PCI-e port. In this embodiment, the disk I/F 27 is connected to the external storage device 3. The external storage device 3 is a general-purpose storage device connected to the disk I/F 27, which is a general-purpose SSD, for example. In the following description, the external storage device 3 is a general-purpose SSD.

The external I/F 20 is an interface for communication with the host system 1 and is for example, a serial ATA (SATA-2.6 or 3.0) or PCI-e port.

The timer 21 is instructed by the command responding portion 22 to start a timer operation. When the counted time reaches previously set deadline time T (a given time T), the timer 21 sends a deadline notification to the command responding portion 22 and read control portion 40.

The host system 1 needs to complete the process of writing data to the SSD 3 or reading data from the SSD 3 within allowable response time, which is previously determined by system specifications. The deadline time T is set to a time which is calculated by subtracting command transfer time (a certain period of time determined by the interface specifications) between the host system 1 and the command responding portion 22 from the allowable response time. The controller 2 thereby controls the delay time of the external storage device SSD 3 within a given time from the perspective of the host system 1.

The period of allowable time for returning a response to the host system 1 depends on the intended use of the system. This time is, for example, 33 ms (time for one frame of television moving pictures: $\frac{1}{30}$ sec) in a system handling videos and 1 to 10 ms in a data logger used in manufacturing plants.

The deadline time T (the given time T) is the maximum allowable delay time for returning a response to the host system 1. The deadline time T is previously set at the timer 21. The deadline time T may be externally written in a memory which can be referenced by the timer 21.

The timer 21 is instructed by the command responding portion 22 to count the previously set deadline time T. When the deadline time T is elapsed, the timer 21 sends a deadline notification to the command responding portion 22 and read control portion 40.

The command responding portion 22 sends and receives commands, responses, and data to and from the host system 1. In response to a command received from the host system 1, the command responding portion 22 sends the data processing portion 24 a control signal which gives a data write or read instruction.

Figure 2:
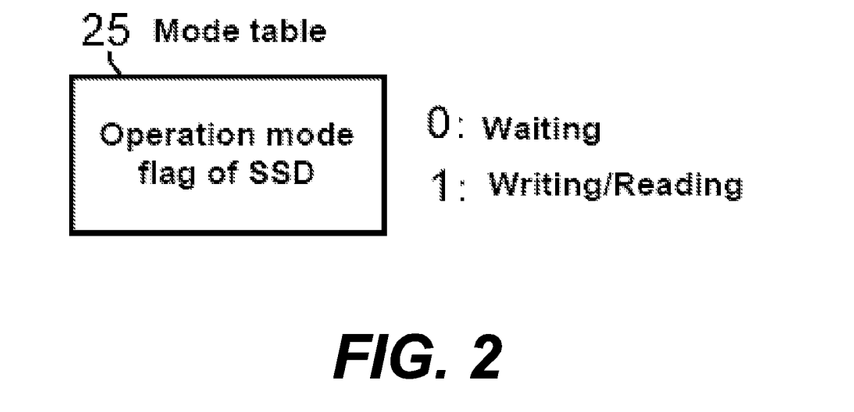
FIG. 2 shows contents of a mode table.

When receiving from the host system 1 a write command which requests to write data to the SSD 3, or a read command which requests to read data from the SSD 3, the command responding portion 22 checks the operation mode of the SSD 3 (whether the SSD 3 is in "Waiting" mode or "Writing/Reading" mode) with reference to the mode table 25. If the operation mode of the SSD 3 is "Waiting," the SSD 3 is writable and readable.

If the received command is a write command, the command responding portion 22 receives write data which is sent from the host system 1 within a given constant period t and holds the write data received in the buffer memory 23. If the received command is a write command and the operation mode of the SSD 3 is "Waiting," the command responding portion 22 outputs to the data processing portion 24, a control signal which gives a write instruction to write data to the SSD 3.

If the received command is a read command, the command responding portion 22 sends the timer 21 a control signal which gives an instruction to start counting. When the received command is a read command and the operation mode of the SSD 3 is "Waiting," the command responding portion 22 outputs to the data processing portion 24, a control signal which gives a read instruction to read data from the SSD 3.

When receiving a deadline notification from the timer 21, the read control portion 40 sends the host system 1 the data which is read from the SSD 3 and held in the buffer memory 23.

When receiving a read command, the command responding portion 22 immediately returns a command reception response to the host system 1. The period of time until the deadline time (given time T) is elapsed after reception of the read command is completed is ensured as a delay guaranteed time in the process of reading data when there is a delay in the process of writing data to the SSD 3.

The buffer memory 23 includes a plurality of storage areas, such as a first storage area 23a and a second storage area 23b. The first storage area 23a is capable of temporarily holding write data received from the host system 1. The second storage area 23b is capable of temporarily holding read data, which is read form the SSD 3. In the buffer memory 23, data received from the host system 1 or SSD 3 are temporarily held (cashed).

The first storage area 23a and/or second storage area 23b are separated into plural sections. The number of sections of each storage area is determined based on a relation between the expected delay time for writing to the SSD 3 and the allowable time as a whole system for the host system 1 to receive a response to a command from the host system 1. In the first embodiment, the first storage area 23a includes two sections, and the second storage area 23b includes three sections.

When receiving a control signal from the command responding portion 22, the data processing portion 24 refers to the mode table 25 to determine whether the operation mode of the SSD 3 is "Waiting." If the operation mode of the SSD 3 is "Waiting" and the control signal from the command responding portion 22 includes a write instruction, the data processing portion 24 sends a write command to the monitor portion 26 and writes to the SSD 3 the write data read from the buffer memory 23. If the operation mode of the SSD 3 is "Waiting" and the control signal from the command responding portion 22 includes a read instruction, the data processing portion 24 sends a read command to the monitor portion 26 and writes to the buffer memory 23 read data which is read from the SSD 3. That is to say, the data processing portion 24 is controlled by the control signals from the command portion 22 to write data to the SSD 3 or read data from the SSD 3.

Specifically, upon receiving the control signal which gives a write instruction from the command responding portion 22, the data processing portion 24 reads data from the first storage area 23a of the buffer memory 23 and writes the read data to the SSD 3. Upon receiving the control signal which gives a read instruction from the command responding portion 22, the data processing portion 24 reads specified data from the SSD 3 and holds the read data in the second storage area 23b of the buffer memory 23.

In the mode table 25, an operation mode flag indicating the operation mode of the SSD 3 connected to the disk I/F 27.

The monitor portion 26 monitors inputs and outputs of commands and data to the disk I/F. The monitor portion 26 monitors the SSD 3 through the disk I/F 27 and sets the operation mode of the SSD 3 as the monitoring result in the mode table 25.

The operation mode flag of the SSD 3 is 0 or 1, for example. The operation mode flag of 0 indicates that the SSD 3 is waiting ("Waiting" mode), and the operation mode flag of 1 indicates that writing or reading is being performed in the SSD 3 ("Writing/Reading" mode).

The monitor portion 26 detects the completion of the process of writing the data to SSD3 or reading the data from SSD3, the monitor portion 26 changes the operation mode flag from "Writing/Reading" mode to "Waiting" mode. The monitor portion 26 detects "Writing" data to SSD3 or "Reading" data from SSD3 in "Waiting" mode, the monitor portion 26 changes the operation mode flag from "Waiting" mode to "Writing/Reading" mode.

The data processing portion 24 writes, to the SSD 3, data specified by the write instruction by the command responding portion 22 when the SSD 3 is confirmed as writable (in "Waiting" mode) by referring to the mode table 25. Moreover, when the SSD 3 is in "Waiting" mode, the data processing portion 24 reads from the SSD 3, data specified by a read instruction by the command responding portion 22.

Next, a description is given of operations of the controller 2 according to the embodiment, separately in terms of operations at normal time and operations in the event of a delay in the process of writing to the SSD.

Figure 3:
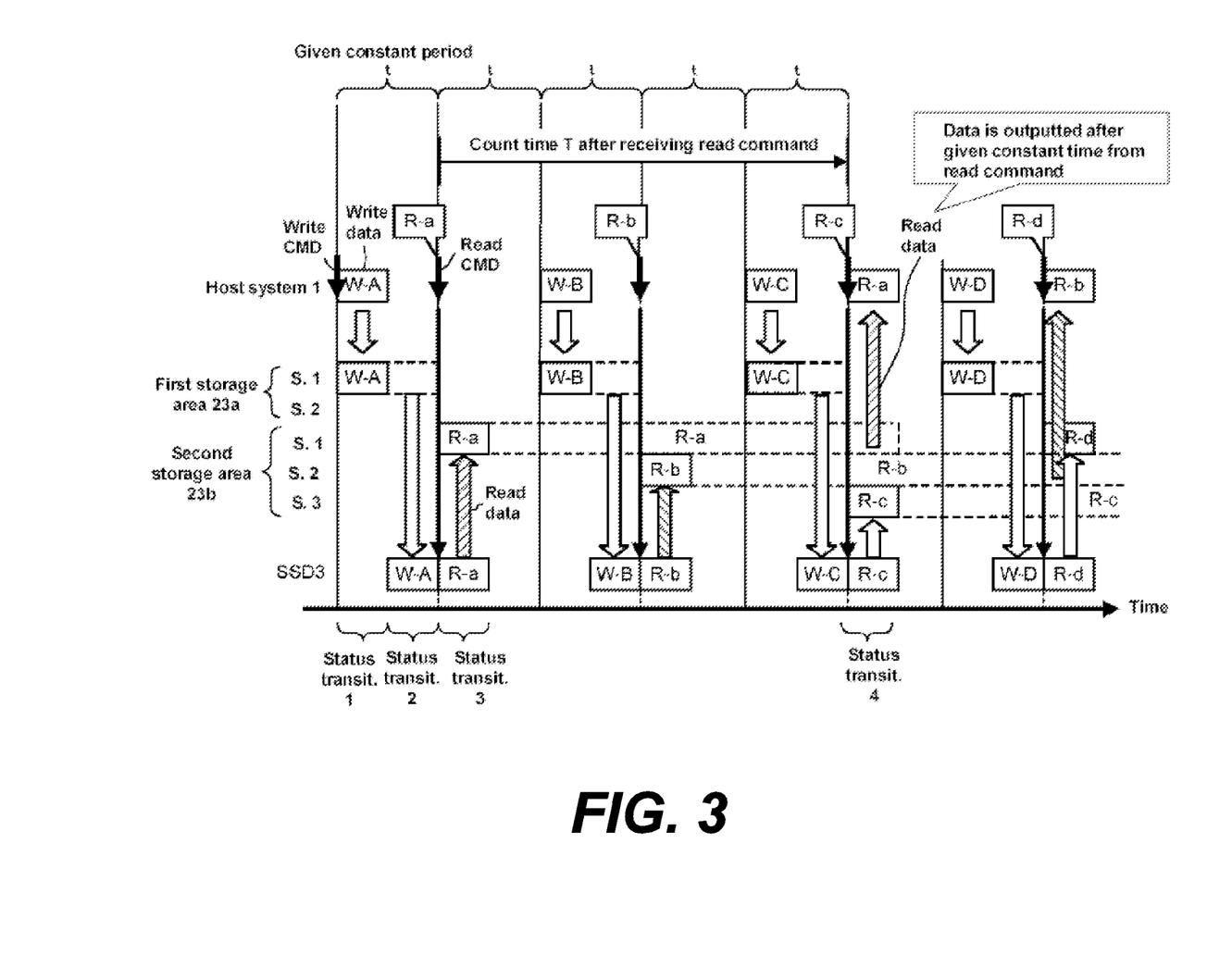
FIG. 3 is a sequence chart showing normal operations.

(Normal Operation)

First, a description is given of normal operations with reference to FIG. 3.

(State Transition 1)

To write data to the SSD 3, the host system 1 first sends a write command to the controller 2.

In the controller 2, the command responding portion 22 interprets the write command and checks the address and write size included in the write command. If the controller 2 is enabled to receive the write data, the command responding portion 22 sends the host system 1 a receivable response indicating that the controller 2 can receive the data.

Upon receiving the receivable response, the host system 1 starts sending data W-A.

The command responding portion 22 sends the received data W-A to the buffer memory 23 and instructs the buffer memory 23 to write the data W-A in the first storage area 23*a*. When the first storage area 23*a* includes data yet to be written to the SSD 3, the command responding portion 22 instructs to the buffer memory 23 to write to another storage area. The command responding portion 22 checks the size of the already received data. When the size of the already received data W-A reaches the write size included in the write command, the command responding portion 22 sends a write completion response to the host system 1.

At the same time, the command response portion 22 refers to the mode table 25 to check the operation mode of the SSD 3.

The operation mode of the SSD 3 may be checked at the time when the command responding portion 22 completes receiving data of unit size (data unit) from the host system 1. In such a case, it is necessary to monitor whether data to be written to the SSD 3 does not get ahead of the data transmitted from the host system 1.

(State Transition 2)

When the command responding portion 22 confirms that the SSD 3 is in "Waiting" mode as the result of the reference to the mode table 25, the command responding portion 22 sends the data processing portion 24 a control signal which gives a write instruction to write data to the SSD 3. The control signal which gives a write instruction includes the write command received from the host system 1 and a section of the buffer memory 23 for storing the data to be written to the SSD 3.

If the SSD 3 is in "Writing/Reading" mode as a result of the reference to the mode table 25, the command responding portion 22 regularly refers to the mode table 25 and waits for a command from the host system 1.

When the data processing portion 24 confirms that the SSD 3 is in "Waiting" mode with reference to the mode table 25, the data processing portion 24 sends a write command to the SSD 3 through the monitor portion 26. At the same time, the monitor portion 26 changes the operation mode flag of the mode table 25 from "Waiting" mode to "Writing/Reading" mode.

After receiving a receivable response from the SSD 3, the data processing portion 24 reads the data W-A from the buffer memory 23 and sends the data W-A to the SSD3. The data W-A is thus written to the SSD 3.

When the size of the written data reaches the write size included in the write command, the SSD 3 sends a write completion response to the controller 2. The monitor portion 26 receives the write completion response" and changes the operation mode flag of the mode table 25 from "Writing/Reading" mode to "Waiting" mode.

(State Transition 3)

To read data from the SSD 3, the host system 1 sends a read command to the controller 2. The command responding portion 22 interprets the read command and checks the address and read size included in the read command. At the same time, the command responding portion 22 sends the timer 21 a control signal which gives an instruction to start counting.

The command responding portion 22 sends a command reception response to the host system 1. At the same time, the command responding portion 22 refers to the mode table 25 and checks the operation mode flag of the SSD 3.

When confirming that the SSD 3 is in "Waiting" mode, the command responding portion 22 sends the data processing portion 24 a control signal which gives a read instruction to read data from the SSD 3. The control signal which gives a read instruction includes the read command received from the host system 1 and information indicating a section of the buffer memory 23 for storing the data read from the SSD 3. In this process, when the data yet to be sent to the host system 1 is included in the second storage area 23*b*, the command responding portion 22 notifies the data processing portion 24 of writing the data to another section of the buffer memory 23.

When the operation mode flag of the SSD 3 in the mode table 25 is "Writing/Reading," the command responding portion 22 regularly refers to the mode table 25 and waits a command from the host system 1.

The data processing portion 24 sends a read command to the SSD 3 through the monitor portion 26. At the same time, the monitor 26 changes the operation mode flag of the mode table 25 from "Waiting" mode to "Writing/Reading" mode. The data processing portion 24 receives data R-a from the SSD 3 and writes the data R-a to the buffer memory 23. When the monitor portion 26 receives a read completion response from the SSD 3 after the data processing portion 24 receives the data from the SSD 3, the monitor portion 26 changes the operation mode flag of the mode table 25 from "Writing/Reading" mode to "Waiting" mode.

(Status Transition 4)

When the given time T is elapsed since the timer 21 starts counting, the timer 21 sends a deadline notification to the read control portion 40 and command responding portion 22. In this embodiment, the given time T is set equal to four times the given period t.

The read control portion 40 reads the data R-a from the buffer memory 23 and sends the data R-a to the host system 1. After sending of the data R-a is completed, the command responding portion 22 sends a read completion response to the host system 1. In this example, while the data R-a is sent to the host system 1, data R-c is received from the SSD 3 and is held in the buffer memory 23.

Figure 4:
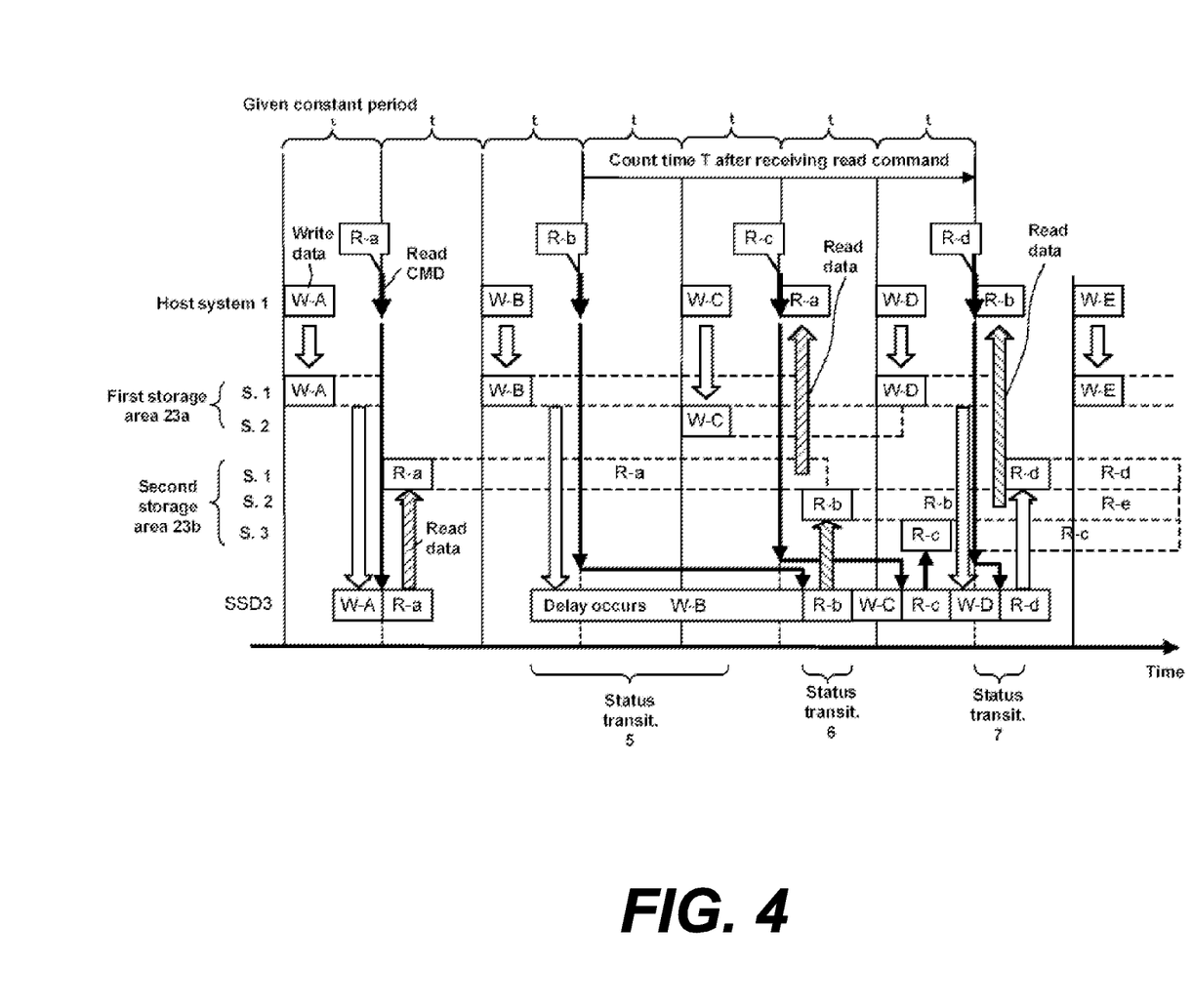
FIG. 4 is a sequence chart showing operations in the event of a delay in a process of writing.

Next, a description is given of operations in the event of a delay in the process of writing to the SSD 3 with reference to FIG. 4.

(Status Transition 5)

When the data processing portion 24 reads the data W-B from the buffer memory 23 and sends the data W-B to the SSD 3, it is assumed that there is a delay in the process of writing the data W-B to the SSD 3. The operation mode flag of the mode table 25 is "Writing/Reading" until the monitor portion 26 receives a write completion response.

If the controller 2 receives a read command for next data R-b from the host system 1 during the delay, the command responding portion 22 interprets the read command and checks the address and read size included in the read command. At the same time, the command responding portion 22 sends the timer 21 a control signal which gives an instruction to start counting. Also when receiving the read command for the data R-a, the command responding portion 22 sends the timer 21 a control signal which gives an instruction to start counting. Accordingly, the timer 21 substantially includes two internal timers.

The command responding portion 22 sends a command reception response to the host system 1. At the same time, the command responding portion 22 checks the operation mode flag of the SSD 3 with reference to the mode table 25.

In this process, since there is a delay in writing to the SSD 3, the result of the reference to the mode table 25 is "Writing/Reading."

Furthermore, the command responding portion 22 interprets a write command for data W-C from the host system 1 and checks the address and write size included in the write command.

When the controller 2 is enabled to receive the data W-C, the command responding portion 22 sends a receivable response to the host system 1. Upon receiving the receivable response, the host system 1 starts sending the data W-C.

In the area of the buffer memory 23 for storing the write data from the host system 1, the data W-B yet to be written to the SSD 3 is in the first section of the first storage area 23a of the buffer memory 23. Accordingly, the command responding portion 22 instructs the buffer memory 23 to write the data W-C to a second section, which is different from the first section.

In the case of this example, for writing of the data W-B is not yet finished at this time, the command responding portion 22 writes the data W-C to the second section of the first storage are 23a of the buffer memory 23 and knows the utilization of the first storage area 23a of the buffer memory 23 (how many sections are used).

The command responding portion 22 writes the received data to the second section of the first storage area 23a of the buffer memory 23 while checking the size of the written data. When the size of the written data reaches the write size included in the write command, the command responding portion 22 sends a write completion response to the host system 1.

(State Transition 6)

When the delay in the process of writing the data W-B to the SSD 3 ends and the monitor portion 26 receives a write completion response from the SSD 3, the monitor portion 26 changes the operation mode flag to "Waiting" mode.

In this process, the command responding portion 22 regularly refers to the mode table 25 and checks if the operation mode flag is changed to "Waiting" mode. Alternatively, upon receiving "Write completion response" from the SSD 3, the monitor portion 26 may notify the command responding portion 22 of completion of writing.

After confirming that the SSD 3 is in "Waiting" mode, the command responding portion 22 processes the read command for the data R-b which is a command received next to the write command for the data W-B. The command responding portion 22 sends a control signal which gives a read instruction and a read command to the data processing portion 24 to instruct the processing portion 24 to read data from the SSD 3. When the operation mode of the mode table 25 is "Writing/Reading" in a similar manner to the above, the command responding portion 22 regularly refers to the mode table 25 and waits for a command from the host system 1.

At the same time, the command responding portion 22 notifies the data processing portion 24 of a section of the buffer memory 23 for holding the read data. In this process, when the data yet to be sent to the host system 1 is in the buffer memory 23, the data read from the SSD 3 is written to a section different from the section from which the data is being sent.

The data processing portion 24 sends the SSD 3 through the monitor portion 26, the read command sent from the command responding portion 22. At the same time, the monitor portion 26 changes the operation mode flag of the mode table 25 from "Waiting" mode to "Writing/Reading" mode.

When the monitor portion 26 receives the read completion response from the SSD 3 after the data processing portion 24 receives the data R-b from the SSD 3, the monitor portion 26 changes the mode flag of the operation mode table 25 to "Waiting" mode.

In this example, while the data R-b is read from the SSD 3, the data R-a, which is held in the first section of the second storage area 23b of the buffer memory 23, is sent to the host system 1.

As a result, the data R-a, which is held in the first section of the second storage area 23b, is sent to the host system 1 at the fourth period (4t) after the command responding portion 22 receives the read command for the data R-a from the host system 1. Accordingly, the host system 1 can use the read data in the following process without any delay as a system.

(State Transition 7)

The timer 21 counts the given time T after the command responding portion 22 receives the read command for the data R-b and then sends a deadline notification to the read control portion 40 and command responding portion 22.

The read control portion 40 reads the data R-b, which is held in the second section of the second storage area 23b of the buffer memory 23, and sends the data R-b to the host system 1.

After the sending of the data R-b is completed, the command responding portion 22 sends a read completion response to the host system 1. In this example, while the data R-b is sent to the host system 1, data W-D is written to the SSD 3, and then data R-d is read from the SSD 3.

In this process, as a result, at the fourth period (4t) after the command responding portion 22 receives the read command for the data R-b from the host system 1, the data R-b, which is held in the second section of the second storage area 23a of the buffer memory 23, is sent to the host system 1. Accordingly, the host system 1 can use the data received from the controller 2 at the fourth period (4t) in the following process with no delay as a system without being influenced by the delay in the process of writing to the SSD 3.

According to the first embodiment, the host system 1 alternately performs reading and writing operations at each given period t, and the storage device controller 2 sends the host system 1 read data which is read from the SSD 3 always at a given time (four periods) after receiving the read command. Accordingly, the storage device controller 2 absorbs the delay time caused in the process of writing to the SSD 3 and allows a general-purpose SSD to be used in real time control. As long as the aforementioned requirements for the deadline time are satisfied, the given time T may be set to another even number times the given period t such as twice or six times instead of four times when the host system 1 performs the read operation and write operation at each given period t.

That is to say, by holding the data read from the SSD 3 in the buffer memory 23 for the maximum waiting time allowable by the system, the delay caused in the process of writing to the SSD 3 is absorbed. In other words, by separating the process concerning the SSD 3 and the process concerning the host system 1 in the controller 2, the delay in response of the SSD 3 does not influence the host system 1, thus guaranteeing the delay in the process of writing to the SSD 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 5:
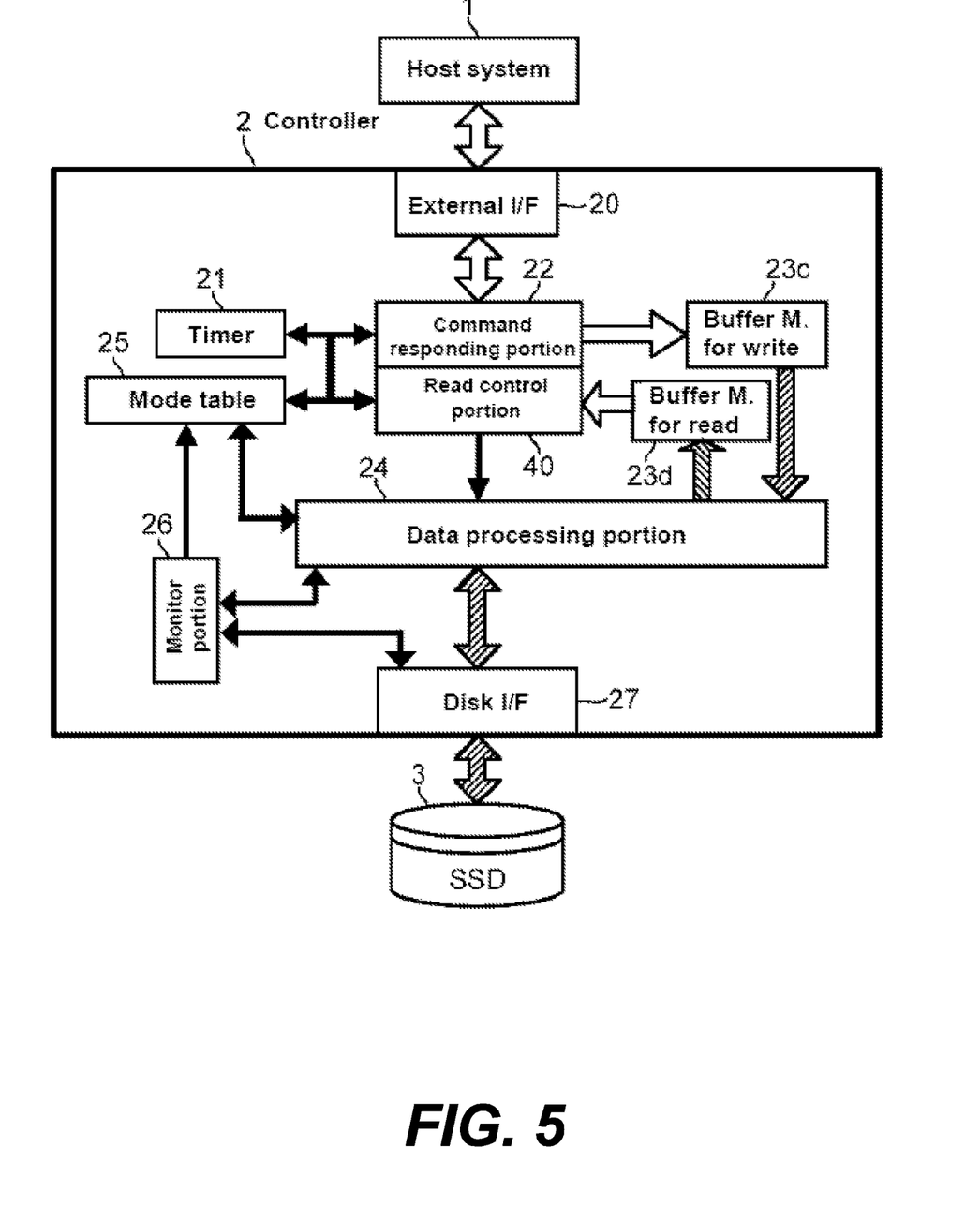
FIG. 5 illustrates a configuration of a controller of another embodiment.

In the aforementioned embodiment, the buffer memory 23 includes the first storage area 23a for write and the second storage area 23b for read. However, as shown in FIG. 5, for example, the controller 2 may include a buffer memory 23c for write and a buffer memory 23d for read.

In this case, provision of the buffer memories increases the component cost. However, read data and write data can be held in the buffer memories which are independent of each other, and the read and write processes can be independently executed. Accordingly, the processing performance can be increased.

The constituent elements shown in the embodiment may be implemented by programs installed in a storage of a computer such as a hard disk drive. Such programs may be stored in a computer-readable electronic medium, and a computer is caused to read the programs from the electronic medium to implement the functions of the present invention. Examples of the electronic medium include recording media such as CD-ROMs, flash memories, and removable media. Furthermore, the functions of the present invention may be implemented by distributing and storing the constituent components in different computers connected via a network and causing the computers functioning as the constituent components to communicate with each other.

What is claimed is:

1. A controller for a solid-state storage device, which is connected to a host system and the solid-state storage device, the controller comprising:
   a mode table in which the operation mode of the solid-state storage device is settable to one of "Writing/Reading" and "Waiting" modes;
   a monitor which monitors the operation mode of the solid-state storage device and sets the operation mode of the solid-state storage device in the mode table;
   a buffer memory including first and second storage areas;
   a timer which counts a preset given time in response to an instruction to start counting and sends a deadline notification when the given time is elapsed;
   a command responder which, when receiving a write command from the host system, receives write data transmitted from the host system within a predetermined period after the write command, holds write data in the first storage area of the buffer memory, and thereafter outputs a write instruction to write data to the solid-state storage device if the operation mode of the solid-state storage device is confirmed as "Waiting" in reference to the mode table, and which, when receiving a read command from the host system, instructs the timer to start counting and thereafter outputs a read instruction to read data from the storage system if the operating status of the solid-state storage device is judges as "Waiting" in reference to the mode table; and
   a data processor which, in response to the write instruction by the command responder, reads data from the first storage area of the buffer memory and writes the read data to the storage system and which, in response to the read instruction by the command responder, reads the specified data from the solid-state storage device and holds the read data in the second storage area of the buffer memory; and a read control which sends the host system the data held in the second storage area of the buffer memory when the deadline notification is received from the timer.

2. The controller according to claim 1, wherein the first and/or second storage areas of the buffer memory include a certain number of sections, the number being set based on a relation between expected delay time of writing to the solid-state storage device and allowable time as a whole system for the host system to receive a response to a request of the host system.

3. The controller according to claim 1, wherein
   the controller includes a first interface connectable to the host system and a second interface connectable to the solid-state storage device, and
   the solid-state storage device is a general-purpose solid-state drive.

4. The controller according to claim 1, wherein
   the write instruction by the command responder includes: the write command that the command responder receives from the host system; and information indicating one of the sections of the buffer memory storing the data to be written to the solid-state storage device, and
   the read instruction by the command responder includes: the read command that the command responder receives from the host system; and information indicating one of the sections of the buffer memory for storing the data read from the solid-state storage device.

5. The controller according to claim 4, wherein the data processor sends the solid-state storage device the write command received by the command responder from the host system and sends the solid-state storage device the read command received by the command responder from the host system.

6. A control method of a controller for a solid-state storage device, the controller being connected to a host system and the solid-state storage device and including a buffer memory having first and second storage areas, the control method comprising the steps of:
   monitoring an operation mode of the solid-state storage device which is "Writing/Reading" mode or "Waiting" mode and setting the operation mode of the solid-state storage device in a mode table;
   counting a preset given time in response to an instruction to start counting, and sending a deadline notification when the given time is elapsed;
   upon receiving a write command from the host system, receiving write data being transmitted from the host system within a predetermined period after the write command, holding the write data received in the first storage area of the buffer memory, and thereafter giving a write instruction to write data to the solid-state storage device when the operation mode of the solid-state storage device is confirmed as "Waiting" in reference to the mode table, then reading data specified by the write instruction from the first storage area, and writing the read data to the solid-state storage device, and
   upon receiving a read command from the host system, instructing the timer to start counting, thereafter giving a read instruction to read data from the solid-state storage device when the operation mode of the solid-state storage device is confirmed as "Waiting" in reference to the mode table, then reading the data specified by the read instruction from the solid-state storage device, and holding the read data in the second storage area of the buffer memory; and sending the host system data held in the second storage area of the buffer memory when the deadline notification is received from the timer.

7. The control method according to claim 6, wherein the first and/or second storage area of the buffer memory include a certain number of storage sections, the number being set based on a relation between expected delay time of writing to the solid-state storage device and allowable time as a whole system for the host system to receive a response to a request of the host system.

8. A controller comprising:
a table in which an operation mode of solid-state storage device is stored to one of "Writing/Reading" and "Waiting" modes;
a monitor which monitors the operation mode of the solid-state storage device and sets the stored operation mode of the solid-state storage device in the table;
a buffer including first and second storage areas;
a timer which counts a preset given time in response to an instruction to start counting and sends a deadline notification when the given time is elapsed;
a command responder configured to receive write data transmitted from the host system within a predetermined period after a write command is received from the host system, hold write data in the first storage area of the buffer, and thereafter output a write instruction to write data to the solid-state storage device if the operation mode of the solid-state storage device is confirmed as "Waiting", and instruct the timer to start counting after a read command is received from the host system and thereafter outputs a read instruction to read data from the storage system if the operating status of the solid-state storage device is judges as "Waiting"; and
a data processor configured to read data from the first storage area of the buffer in response to the write instruction by the command responder and write the read data to the storage system, and read the specified data from the solid-state storage device in response to the read instruction by the command responder and hold the read data in the second storage area of the buffer; and
a read control which sends the host system the data held in the second storage area of the buffer when the deadline notification is received from the timer.

9. The controller according to claim 8, wherein the first and/or second storage areas of the buffer include a certain number of sections, the number being set based on a relation between expected delay time of writing to the solid-state storage device and allowable time as a whole system for the host system to receive a response to a request of the host system.

10. The controller according to claim 8,
wherein the controller includes a first interface connectable to the host system and a second interface connectable to the solid-state storage device, and
the solid-state storage device is a general-purpose solid-state drive.

11. The controller according to claim 8, wherein the write instruction by the command responder includes: the write command that the command responder receives from the host system; and information indicating one of the sections of the buffer storing the data to be written to the solid-state storage device, and the read instruction by the command responder includes: the read command that the command responder receives from the host system; and information indicating one of the sections of the buffer for storing the data read from the solid-state storage device.

12. The controller according to claim 8, wherein the data processor sends the solid-state storage device the write command received by the command responder from the host system and sends the solid-state storage device the read command received by the command responder from the host system.

* * * * *